(12) United States Patent
Kuan et al.

(10) Patent No.: US 6,818,917 B2
(45) Date of Patent: Nov. 16, 2004

(54) VOLTAGE-SWITCHABLE AND-TUNABLE AND ENVIRONMENT-INSENSITIVE MULTI-COLOR SUPERLATTICE INFRARED PHOTODETECTOR

(75) Inventors: Chieh-Hsiung Kuan, Taipei (TW);
Hsin-Cheng Chen, Tainan Hsien (TW);
Chun-Chi Chen, Tainan (TW);
Sheng-Di Lin, Taipei (TW);
Jen-Hsiang Lu, Taichung (TW)

(73) Assignees: National Taiwan University, Taipei (TW); Integrated Crystal Technology Inc., Hsinchu (TW)

( * ) Notice: Subject to any disclaimer, the term of this patent is extended or adjusted under 35 U.S.C. 154(b) by 0 days.

(21) Appl. No.: 10/385,631

(22) Filed: Mar. 12, 2003

(65) Prior Publication Data

US 2004/0178421 A1 Sep. 16, 2004

(51) Int. Cl.[7] .................. H01L 29/205; H01L 31/0304
(52) U.S. Cl. .................. 257/21; 257/184; 257/440
(58) Field of Search ................ 257/440, 184, 257/21

(56) References Cited

U.S. PATENT DOCUMENTS 5,384,469 A * 1/1995 Choi .......................... 257/21
6,326,639 B1 * 12/2001 Schneider et al. ............ 257/17
6,455,908 B1 * 9/2002 Johnson et al. ............. 257/440

* cited by examiner

Primary Examiner—Jerome Jackson
(74) Attorney, Agent, or Firm—Troxell Law Office PLLC

(57) ABSTRACT

An infrared photodetector structure with voltage-tunable and -switchable photoresponses constructed of superlattices and blocking barriers. The photoresponses of the double-superlattice structure are also insensitive to the operating temperature changes. By using $GaAs/Al_xGa_{1-x}As$ system, the feasibility of this idea is verified. In the embodiment, the photoresponses can be switched between 6~8.5 and 7.5~12 m by the bias polarity and are also tunable by the bias magnitude in each detection wavelength range. In addition, the photoresponses are insensitive to operating temperatures ranging from 20 to 80 K. For the SLIP with few periods, the responsivity may be higher than the one with many periods and the operational temperature is higher. These results show the invention can be useful in the design of multicolor imaging systems. This invention is not only applicable for wavelengths comparable with the embodiment, but can also be applied to the detection of radiation in the range from visible to extreme far infrared.

10 Claims, 15 Drawing Sheets

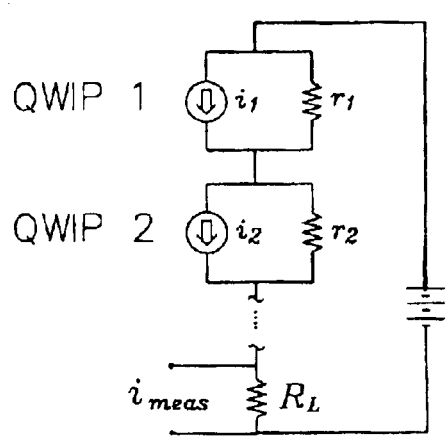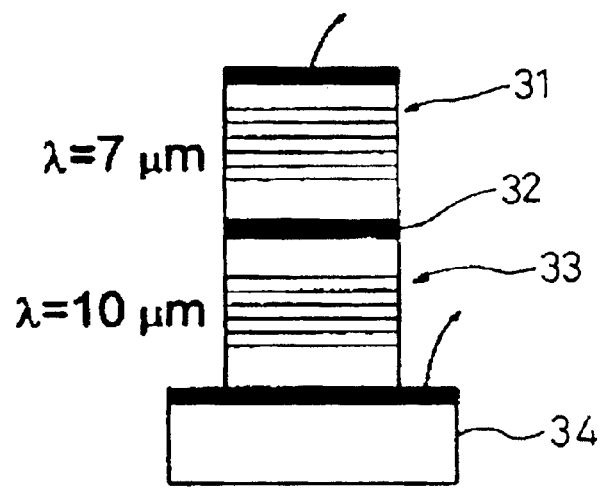
(PRIOR ART)
FIG. 3a
(PRIOR ART)
FIG. 3b

VOLTAGE-SWITCHABLE AND-TUNABLE AND ENVIRONMENT-INSENSITIVE MULTI-COLOR SUPERLATTICE INFRARED PHOTODETECTOR

BACKGROUND OF THE INVENTION

1. Technical Field

The present invention relates to an infrared photodetector, more particularly, the present invention relates to a structure with voltage-tunable and voltage-switchable photoresponses constructed of superlatuices and blocking barriers.

2. Description of Related Art 2-1. Semiconductor Infrared Photodetectors

Infrared photodetectors can be cataloged into two main groups. In one group, called thermal detectors, a change in some electrical property of the detector is induced by the temperature increment due to the absorption of the incident infrared radiation. In the other group, called photon or quantum detectors, the carriers in the material can be excited by photons with appropriate energy and become detectable by the external circuit. Although the photon detectors for the FIR detection need to be operated at cryogenic temperatures, they exhibit better detectivity and temporal response than the thermal detectors. For applications in which the sensitivity and response time are highly emphasized, photon detectors are the better choices.

The photon detectors can be further divided into several types—intrinsic, extrinsic, internal photoemission and intersubband photodetectors. The extrinsic photodetectors need to be cooled to relatively low temperatures (<40 K). The main disadvantage of the internal photon emission photodetectors is their low quantum efficiency because the carriers are activated by free carrier absorption. The other type of photon detectors that use bandgap absorption is classified as intrinsic photodetector. The material choices for intrinsic photodetectors are limited to those semiconductors with bandgap absorption in the FIR region. Among them, HgCdTe is the most important one. However, the growth of large area films of low bandgap materials with high uniformity still remains challenging. Therefore, wide bandgap based intersubband photodetectors with more mature growth and processing technologies are more suitable for the fabrication of large photodetector arrays.

Please refer to FIG. 1, which shows intersubband photodetectors that are made of multiple quantum wells or superlattices. For multiple quantum wells 10, adjacent wells 10 are separated by thick barriers 11. Because the coupling of electron wavefunctions between adjacent wells is negligible, electron energies in the quantum wells 10 are quantized into discrete levels. On the contrary, adjacent wells 10 in a superlattice 12 are separated by thin barriers. As a result of the coupling of electron wavefunctions between adjacent wells 10, minibands form in the superlattice region 12.

The superlattice 12 has broader spectral response than the quantum well 10 because of the transition between minibands instead of discrete states. In addition, the is coupling of electrons in adjacent wells 10 makes the superlattice 12 a low impedance structure. In this invention, the low impedance characteristic of superlattices 12 is utilized to design multicolor infrared photodetector.

2-2. Some State of the Art Intersubband Multicolor Infrared Photodetectors

Because imaging systems capable of multicolor detection are valuable in various applications including astronomical observation, military and medical science, the development of intersubband multicolor infrared photodetectors has drawn much attention in recent years. In the following, some state of the art multicolor infrared photodetector structures are recited.

Please refer to FIG. 2, which shows a Multi-stack infrared photodetector with separating conducting layers. As shown in FIG. 2, multistack infrared photodetector 2 is fabricated by stacking multiple quantum wells 21 designed for different wavelengths on the same substrate 21 during the growth of the structure. This kind of multicolor photodetector 2 can be further divided into two types (A. Kock, E. Gomick, G. Abstreiter, G. Bohm, M. Walther and G. Weimann, Appl. Phys. Lett 60, 2011, 1992; Sarath D. Gunapala, Sumith V. Bandara, A. Singh, John K. Liu, Sir B. Rafol, E. M. Luong, et al, IEEE Transactions on Electron Devices, 47, 970, 2000). (i) The different detector stacks are isolated by thick conducting layers. The operation of each stack is actually the same as if the stack is grown as a single photodetector 2. This structure simply integrates several different photodetectors 2 onto the same substrate 22. FIG. 2 shows a multicolor focal plane array realized with the multi-stack infrared photodetectors 2. Obviously, some extra process steps are needed to make only one detector stack 21 of a pixel to connect to the corresponding unit cell of the readout circuit. For short wavelength detection, the upper stacks designed for long wavelength are disabled by metal gratings 211; while for short wavelength detection, the bottom stacks are disabled by the lateral metal 212. The pixels shown in FIG. 2 for long and short wavelength interlaces spatially. Because pixels for different wavelengths occupy different physical locations, the chip area is utilized inefficiently. The maximum achievable resolution is therefore limited. In addition, extra process steps also increase cost and decrease yield rate.

(ii) Please refer to FIG. 3(b), which shows the structure of Multi-stack infrared photodetector with separating conducting layer. As shown in FIG. 3(b) (L. C. Lenchyshyn, H. C. Liu, M. Bunchanan and Z. R. Wasilewski, J. Appl. Phys. 79, 8091, 1996), two stacks 31, 33 for different wavelength regions are stacked on the same substrate 34 and are separated by a thick conducting layer 32. This kind of photodetector is operated as a two terminal device. The difference from the multi-stack photodetector mentioned in (i) is that the middle contact only serves as an internal connection for the two stacks 31, 33. The photodetector operates as if there is two discrete photodetectors connect in series.

Please refer to FIG. 3(a), which shows the small signal equivalent circuit. The measurable photocurrent generated in one of the stacks 31, 33 is determined by the dynamic resistance of stack 31 or 33. Because the current-voltage relation is not a linear, the dynamic resistance of the photodetector stack 31 or 33 changes with the operating point. As a result, by changing the total external bias, the dynamic resistance of stack 31 or 33 and therefore the portion of the generated photocurrent can be varied by the external bias. Although this structure can achieve multicolor detection, there are several disadvantages. First, the lack of accurate model for the current-voltage relation hinders the prediction in the design phase of the photoresponses versus bias voltage. Second, because the dynamic resistance of the short wavelength stack 31 is generally higher than the long wavelength stack 33 under low bias, short wavelength dominates the spectral response under low bias. In order to observe long wavelength photoresponses, the photodetector needs to be operated in a high bias voltage to saturate the dynamic resistance of the short wavelength stack 31.

However, both dark current and noise increase under such high bias condition. Third, the dynamic resistance changes with the operating temperature and background radiation. Therefore the photoresponses are sensitive to the variation of the environment. Fourth, the long wavelength spectral response is unavoidable accompanied by strong photoresponses in the short wavelength region.

Please refer to FIG. 4, which shows a Multi-stack infrared photodetector without separating conducting layers. As shown in FIG. 4 (K. L. Tsai, K. H. Chang, C. P. Lee, K. F. Huang, J. S. Tsang and H. R. Chen, Appl. Phys. Lett. 62, 3504, 1993), this kind of photodetector also stacks photodetectors for different wavelengths. However, there are no conducting layers separating the different stacks 43. Multicolor detection in this structure is achieved by the electric field domains formed in the different stacks under different bias voltages. At low bias voltage, more of the applied voltage drops across the short wavelength stack to preserve current continuity. Therefore, the spectral photoresponse is dominated by the short wavelength stack under low bias conditions. To observe long wavelength responses, a high bias is needed for the long wavelength stack to acquire enough bias drop. This kind of multicolor photodetector also has the same disadvantages as the structure discussed in FIG. 2.

Please refer to FIG. 5, which shows a Compound multi-stack infrared photodetector. As shown in FIG. 5 (M. Z. Tidow, Xudong Jiang, Sheng S. Li and K. Bacher, Appl. Phys. Lett. 74, 1335, 1999), combine the structures discussed in FIG. 2 and FIG. 4, and photodetectors with more detection wavelengths can be achieved. However, this kind of photodetector suffers the same disadvantages discussed above.

Please refer to FIG. 6, which shows an Asymmetric quantum well infrared photodetector. As shown in FIG. 6 (E. Martinet, E, Rosencher, F. Luc, Ph. Bois, E. Costard and S. Delaitre, Appl. Phys. Lett. 61, 246, 1992), the use of asymmetry quantum well enhances the oscillator strength for the bound-to-continuous transition at the expense of the reduction of the oscillator strength for the bound-to-bond transition. Because electrons excited to the second bound state can not tunnel through the barrier under low biases, the photoresponses at low biases are dominated by the short wavelength due to bound-to-continuous transitions as shown in the inset of FIG. 6. Under a high bias, the excited bound state electrons can tunnel through the barrier and contribute to the long wavelength spectral response. Therefore multicolor detection is allowable in this structure. Since both the detecting wavelengths and the tunneling probability for the bound electrons are related to the structure of the asymmetry quantum well, it is impossible to control the detecting wavelengths and optimize the performances individually. The lack of the design flexibility is the main drawback of this type of multicolor detector.

Please refer to FIG. 7, which shows Coupled quantum wells infrared photodetector. As shown in FIG. 7 (M. Z. Tidrow, K. K. Choi, C. Y. Lee, W. H. Chang, F. J. Towner and J. S. Aheam, Appl. Phys. Lett. 64, 1268, 1994), several quantized states exist in the structure because of the coupled quantum wells 72, 73. Electron transitions between different states make multicolor detection possible. However, this structure also lacks of the design flexibility as the asymmetric quantum well structure.

Please refer to FIG. 8, which shows Stark-effect quantum wells infrared photodetector. Using the Stark-effect in asymmetry quantum wells, the detecting wavelength can be tuned continuously by the applied bias. The disadvantages of this kind of detector are the narrow tuning rage, the dependence of responsivity on the applied bias, and the lack of design flexibility.

In this invention, the superlattice-based structure is proposed to overcome the disadvantages of the aforementioned multicolor infrared photodetectors. Before introducing the embodiment of this idea using GaAs/Al$_x$Ga$_{1-x}$As system, the advantages of the superlattice is introduced.

In the following, the advantages of using superlattice in the design of infrared photodetectors are discussed.

(a) The superlattices have wider detection ranges than quantum wells due to the minibands. By designing suitable energy filter for the photoelectrons, voltage-tunable multicolor photodetector can be realized.

(b) Lower operating voltage and power consumption. This can save considerable power consumption for the operation of a focal plane array.

(c) By adjusting the parameters related to wells and barriers of the superlattice, the superlattice minibands can be flexibly tuned.

(d) The resistance of the superlattice is low. Since the voltage drop across the superlattice is negligible, the voltage distribution is determined by high impedance is blocking layers.

(e) The superlattice structure is simple and the total thickness is thin. Therefore, the growth time and cost can be reduced.

These characteristics make the superlattice suitable for the design of infrared photodetectors. For example, a voltage-tunable infrared photodetectors can be realized by a superlattice 81 with a high-impedance blocking barrier 82 as shown in FIG. 8. FIG. 9 shows the measured spectral responses. The blocking layer 82 of this photodetector design not only reduces dark current but also serves as an energy filter for the photoelectrons. Because the impedance of the blocking layer 82 is much higher than the superlattice 81, the external bias almost totally falls on the blocking barrier 82. Therefore, the effect of the blocking layer 82 as an energy filter can be tuned by changing the bias voltage. Under low biases photoelectrons excited by short wavelength light with energy higher than the blocking layer 82 can pass through the blocking layer 82 and contribute to photocurrent. However photoelectrons excited by long wavelength light do not have sufficient energy to pass through the blocking layer 82. As a result, the spectral responsivity is dominated by short wavelength at low biases. When external bias increases in magnitude, the photoelectrons excited by long wavelength light can tunnel through the blocking layer 82 by the assistance of the electric field. Therefore, at high biases, both long and short wavelength responsivity can be observed. The simple structure containing a superlattice 81 and a blocking layer 82 illustrates the use of superlattice for the design of a multicolor infrared photodetector. (Applied Physics Letters, 80, p. 2251, 2002). Another illustration of using superlattice to suppress dark-current and increases the operating temperatures can be found in the paper (Proc. SPIE Vol.4288, p. 151–162, California, USA. 2001). The two examples show the flexibility of using superlattice in the design of the infrared photodetectors.

The present invention further utilizes the characteristics of the superlattice to design a double-superlattice structure with a blocking barrier to separate the two superlattices designed for different wavelength regions. The photoresponses caused by the superlattices under both voltage polarities can be optimized individually by the design of the barrier heights at both sides of the blocking barrier. Besides, the operation voltage magnitude can be controlled through the thickness of the blocking barrier. This invention provides a very flexible method to realize multicolor infrared photodetectors and improves many of the disadvantages of the other multicolor photodetector design mentioned above. In the following, the embodiment of this invention is illustrated.

SUMMARY OF THE INVENTION

This invention provides an infrared photodetector structure with voltage-tunable and -switchable photoresponses constructed of superlattices and blocking barriers, wherein the superlattice-based structure is proposed to overcome the disadvantages of the aforementioned multicolor infrared photodetectors. Before introducing the embodiment of this idea using GaAs/Al$_x$Ga$_{1-x}$As system, the advantages of the superlattice is introduced.

BRIEF DESCRIPTION OF THE DRAWINGS

The present invention can be more fully understood by reference of the following description and accompanying drawings, in which:

FIG. 3(a) is the small signal equivalent circuit of Multi-stack infrared photodetector with separating conducting layer, FIG. 3(b) is the structure of Multi-stack infrared photodetector with separating to conducting layer;

Figure 14A:
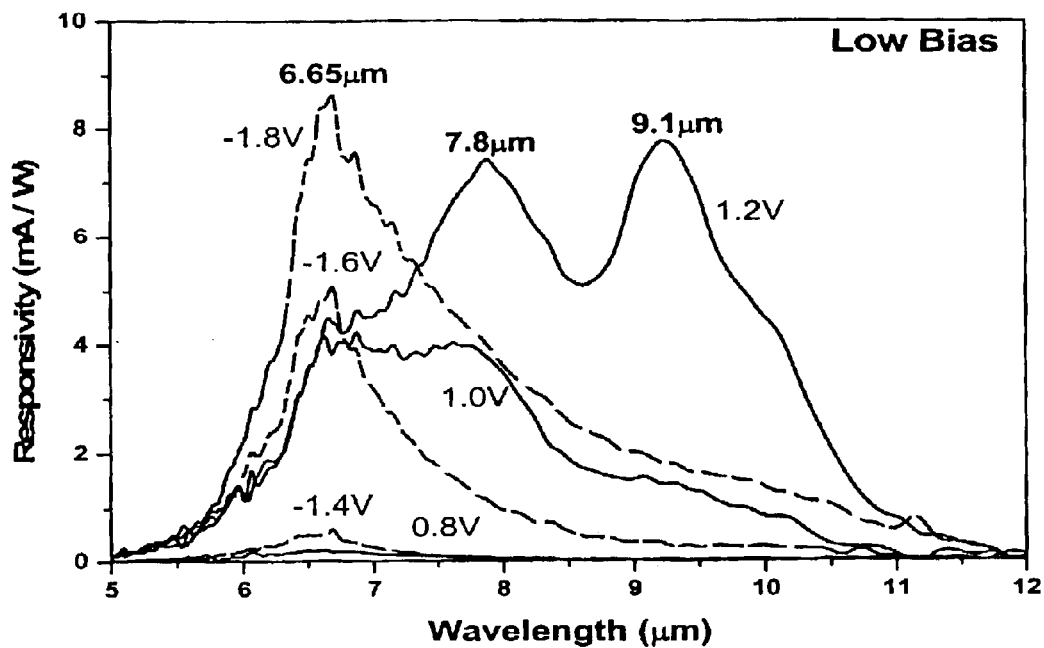
Figure 14B:
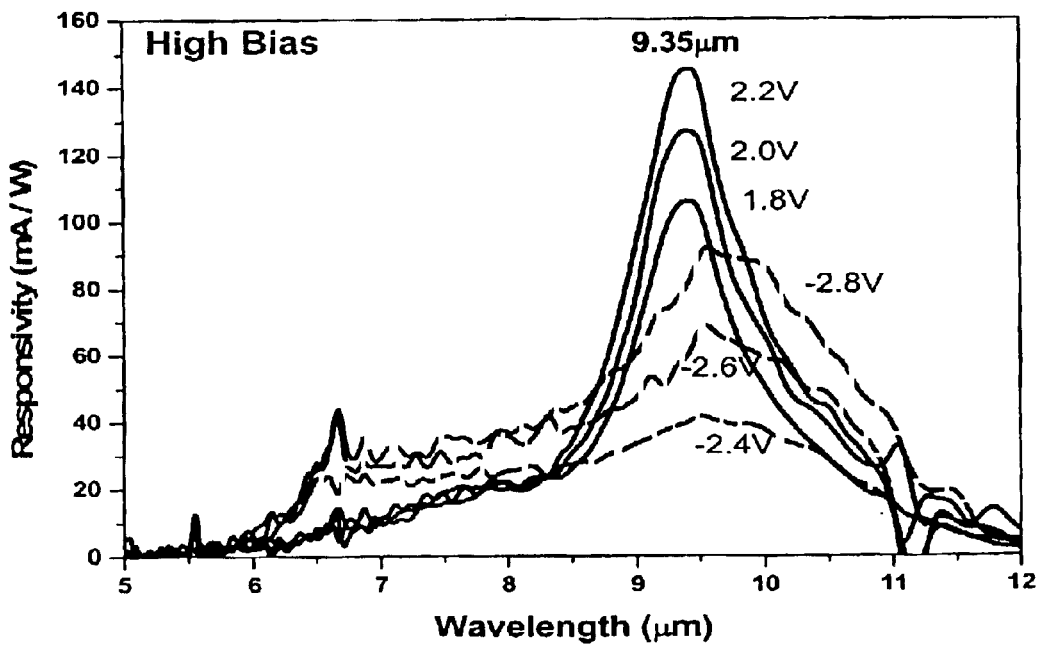
Figure 15:
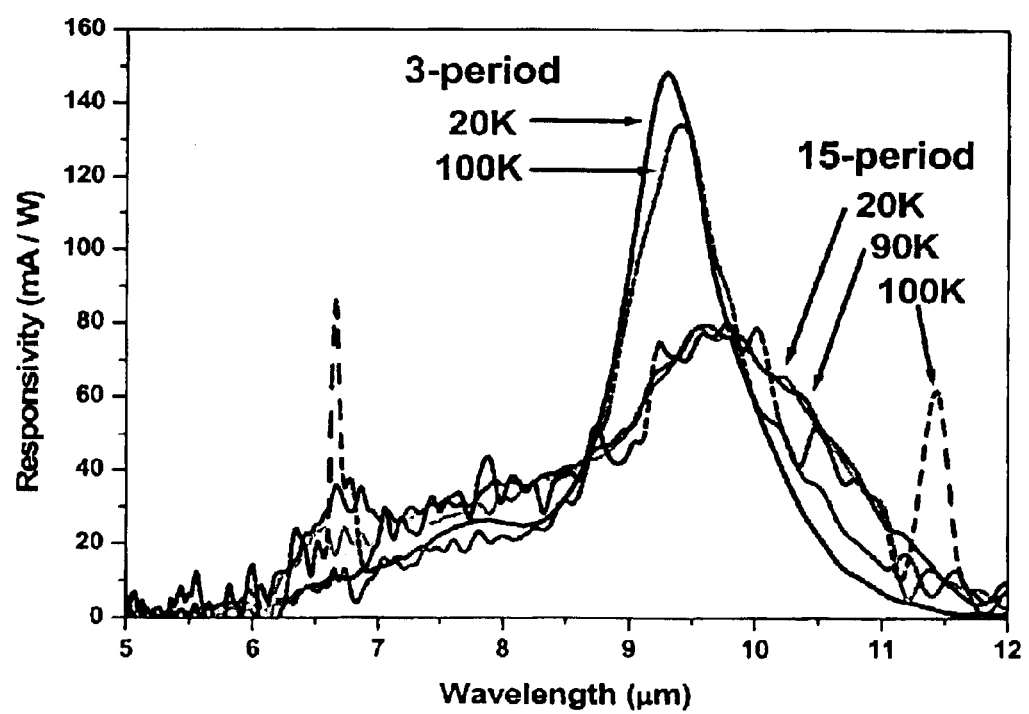

the photoelectrons at the bottom and top states of the second miniband in 3-period SLIP have larger velocity than in 15-period miniband;

FIG. 14 shows the photoresponse with (a) low bias magnitude and (b) high bias magnitude of both positive and negative biases. The solid lines are responsivity under positive biases (3-period SLIP) and dashed lines are the responsivity under negative biases (5-period SLIP). The peak responsivity is shifted from short to long wavelength as biases increasing; and FIG. 15 shows the spectral responsivity of 3-period superlattice at 1.8V at temperature 20K and 100K and 15-period one at −2.7V at temperature 20K, 90K and 100K.

DETAILED DESCRIPTION OF THE PREFERRED EMBODIMENTS

Figure 1:
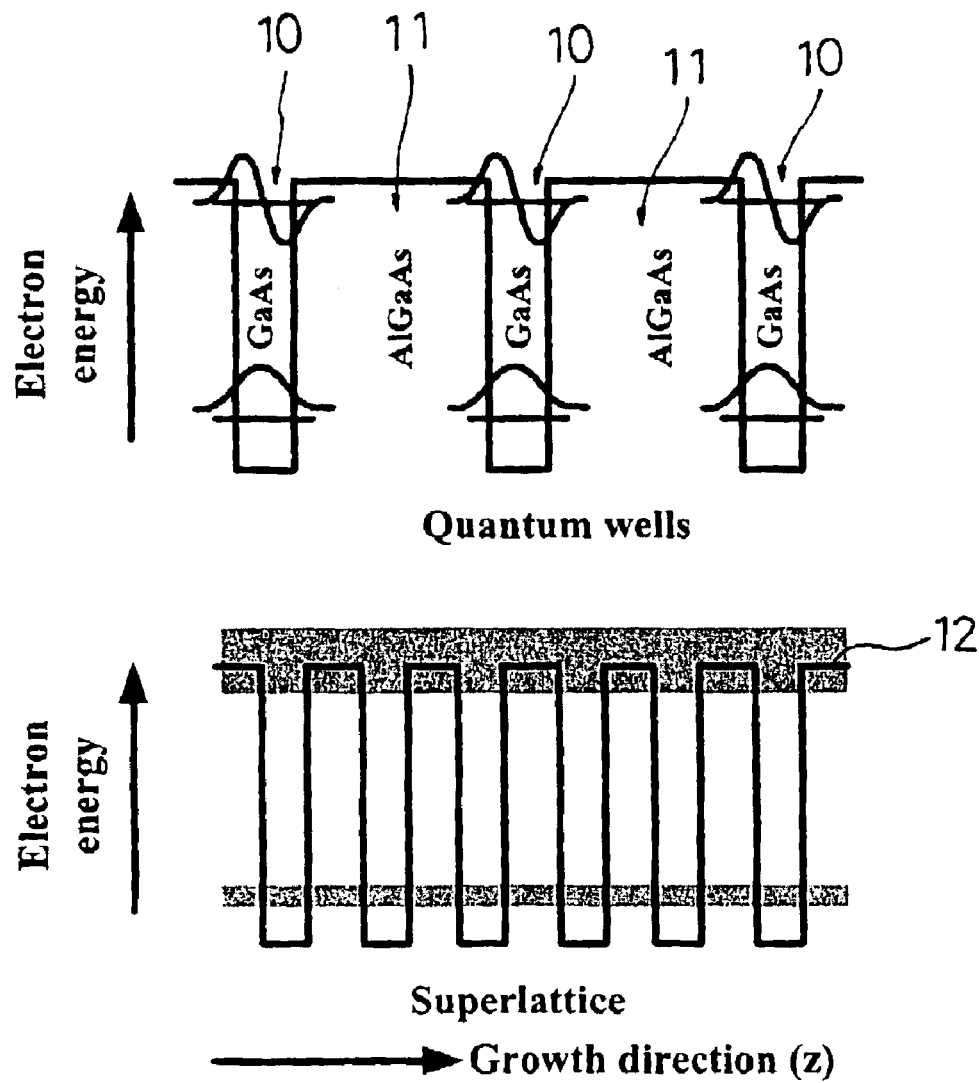
FIG. 1 shows intersubband photodetectors that are made of multiple quantum wells or superlattices.
Figure 2:
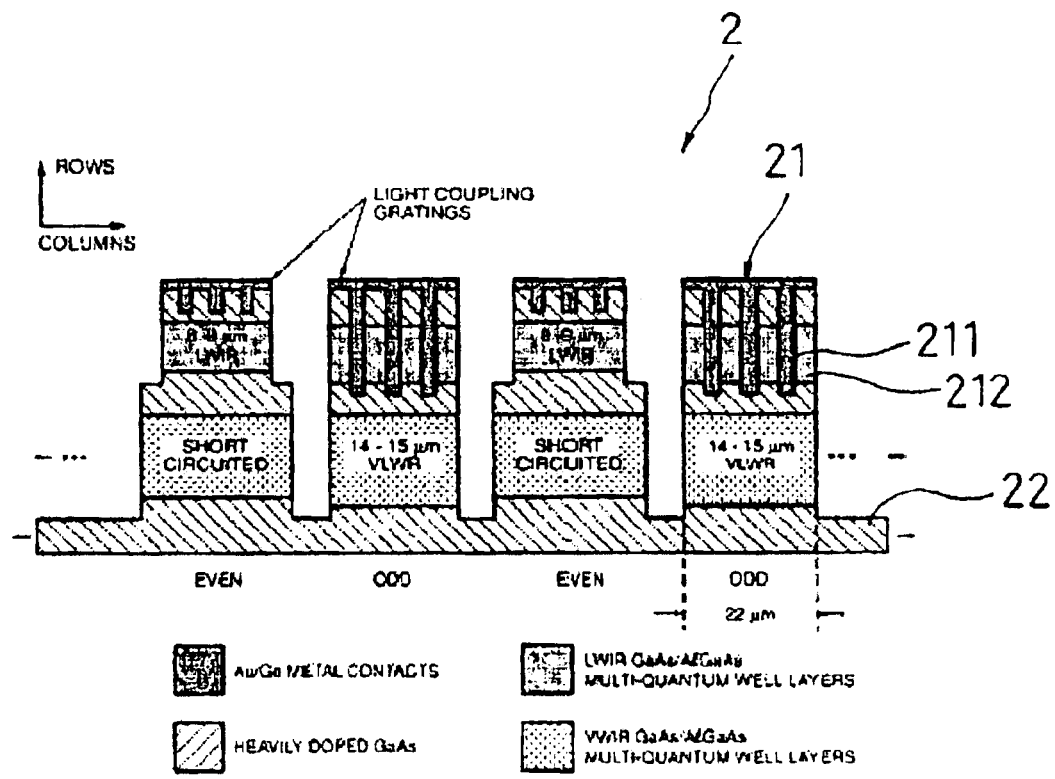
FIG. 2 shows a multicolor focal plane array realized with the multi-stack infrared photodetectors.
Figure 4:
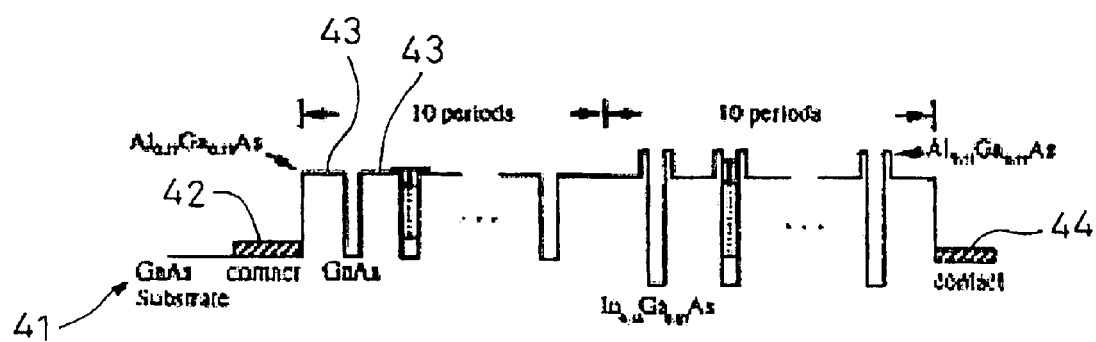
FIG. 4 shows a Multi-stack infrared photodetector without separating conducting layer.
Figure 5:
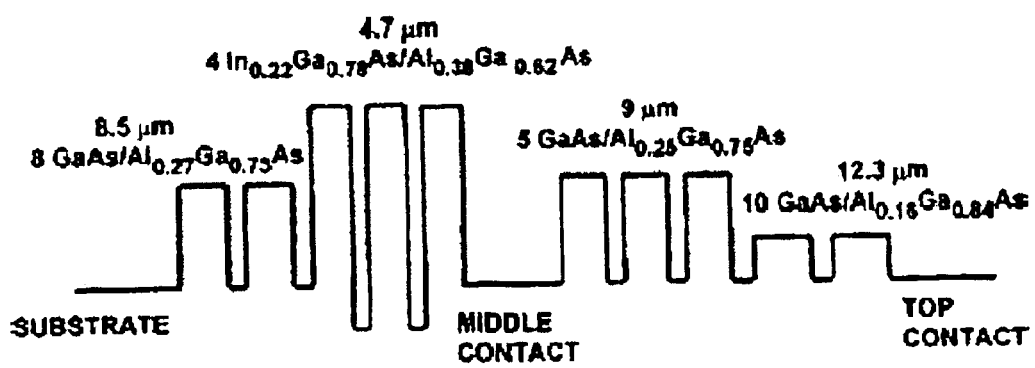
FIG. 5 shows a compound multi-stack infrared photodetector.
Figure 6:
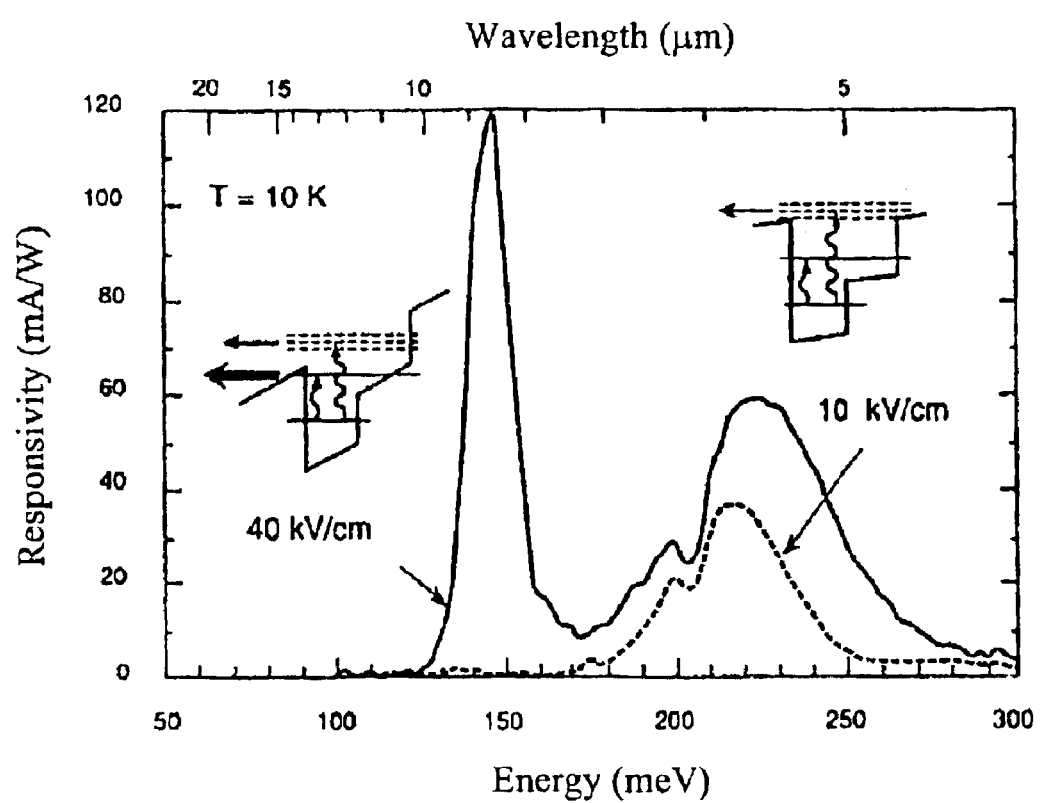
FIG. 6 shows an asymmetric quantum well.
Figure 7:
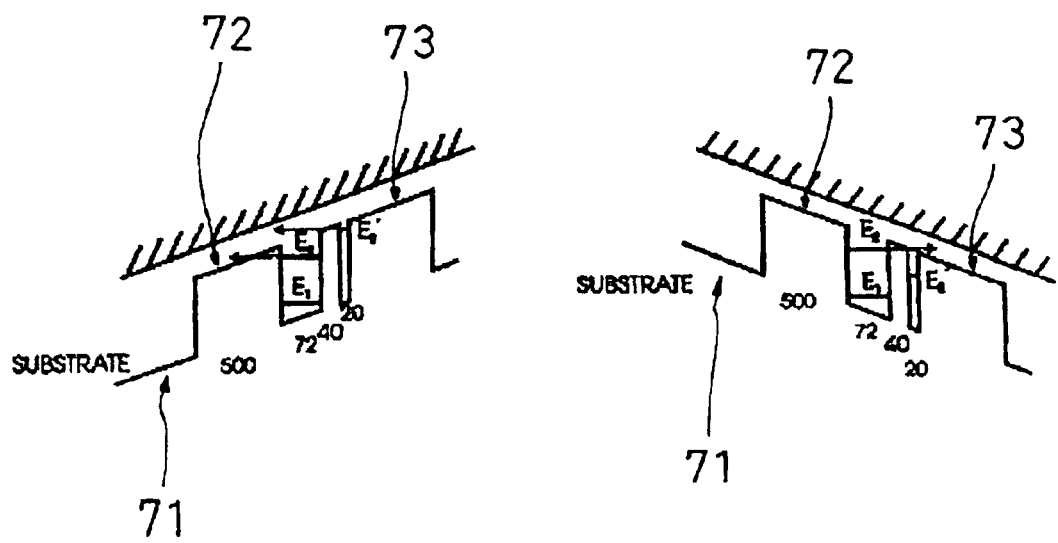
FIG. 7 shows a coupled quantum wells infrared photodetector.
Figure 8:
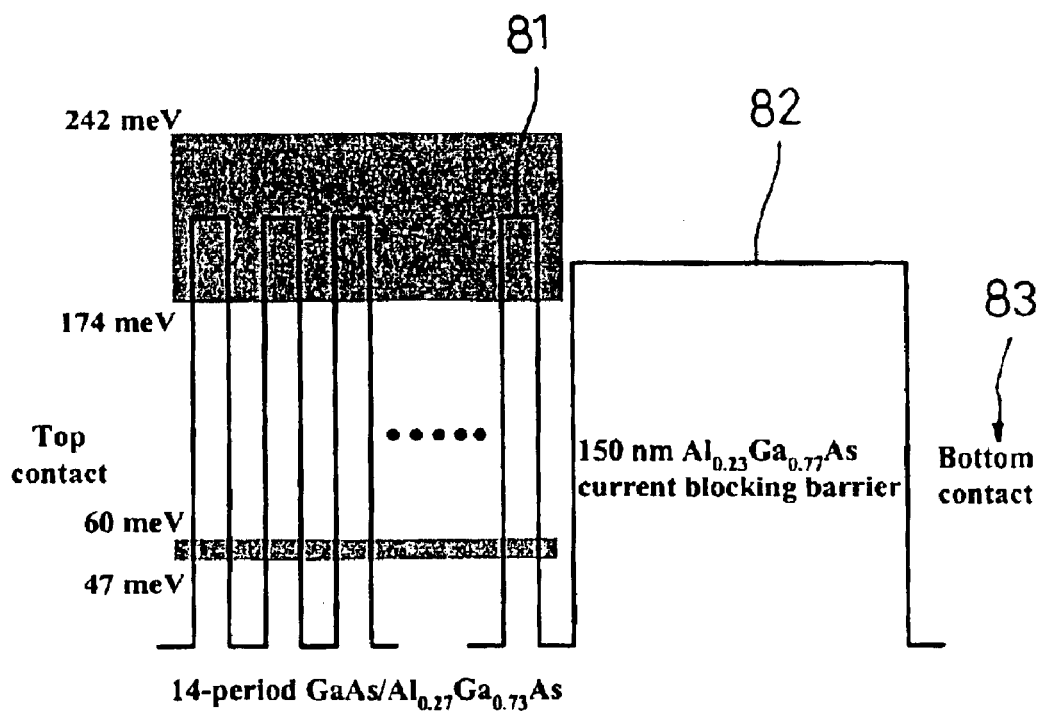
FIG. 8 shows an infrared photodetector constructed with a superlattice and a blocking layer.
Figure 9:
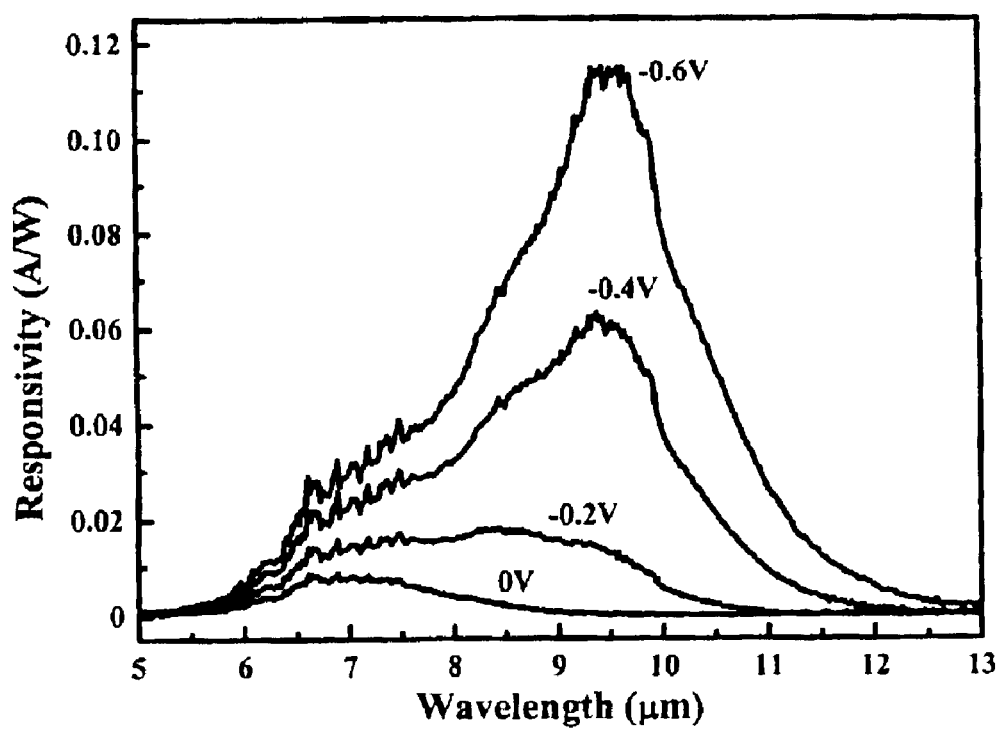
FIG. 9 shows a Voltage-tunable infrared photodetector with a singe superlattice and a current blocking layer.
Figure 10A:
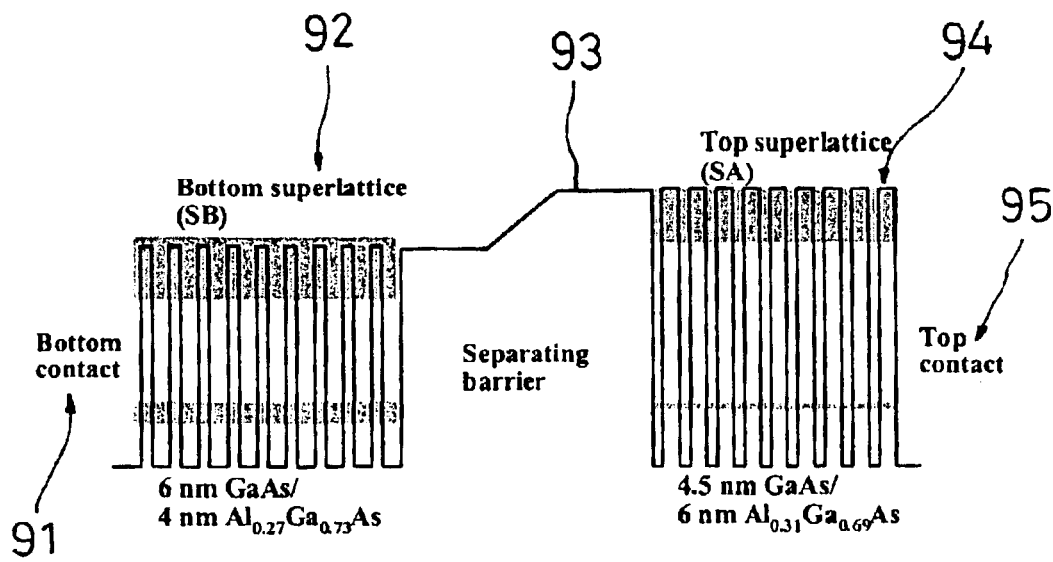
FIG. 10(a) shows the band structure of a Voltage-tunable and -switchable double-superlattice infrared photodetector in accordance with an embodiment of the present invention.

Please refer to FIG. 10(a), which shows the band structure of our photodetector in accordance with an embodiment of the present invention. The system we described here is belonged to III/V semiconductor materials. The photodetector of the present invention contains sequentially a bottom contact layer 91, preferably is 500 nm, a bottom superlattice 92, preferably is 14-period, a blocking barrier 93, another top superlattice 94, preferably is 14-period, and a top contact layer 95, preferably is 400 nm. Each period of the bottom 92 and top supedattices 94 is respectively composed of 6 nm GaAs well and 4 nm Al$_{0.27}$Ga$_{0.73}$As barrier, and 4.5 nm GaAs well and 6 nm Al$_{0.31}$Ga$_{0.69}$As barrier. The well and barrier thickness are less than 10 nm preferably and Al composition ranges from 0 to 1. The blocking barrier 93 consists of a 60 nm Al$_{0.27}$Ga$_{0.73}$As layer, a 50 nm graded Al$_x$Ga$_{1-x}$As layer with x increasing from 0.27 to 0.31, and a 60 nm Al$_{0.31}$Ga$_{0.69}$As layer preferably. Al composition's range is from 0 to 1. The thickness of each layer should be less than 200 nm. The blocking barrier can also be only one Al$_x$Ga$_{1-x}$As layer with x varying from 0 to 1. The blocking layer thickness should be less than 200 nm. Both the contact layers 91, 95 and the superlattice wells 92, 94 are doped with 1×10$^{18}$ cm$^{-3}$ of Si. The doping concentration ranges from 1×10$^{17}$ to 1×10$^{19}$ cm$^{-3}$ preferably. The blocking barrier 93 and the superlattice barriers 92,94 are left undoped preferably.

Figure 10B:
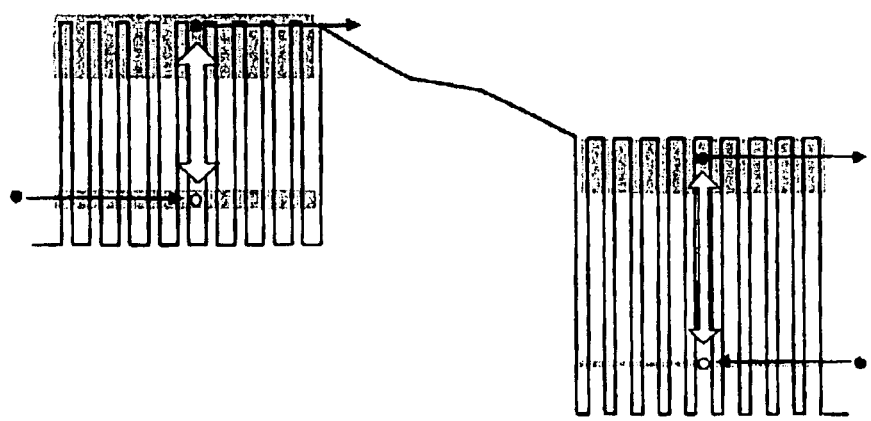
FIG. 10(b) shows the band structure of a Voltage-tunable and -switchable double superlattice infrared photodetector under a positive bias in accordance with an embodiment of the present invention.

Please refer to FIG. 10(b), which shows the band structure of a Voltage-tunable and -switchable double-superlattice infrared photodetector under a positive bias in accordance with an embodiment of the present invention. In order to show the design principles, the band structure of our detector under a positive bias is shown in FIG. 10(b). The voltage polarity is taken as positive if high potential is applied on the top contact. Because of the low-resistance characteristic of the superlattices, the applied voltage is almost totally dropped on the separating batter. For convenience, the top superlattice 94 is designated as superlattice A (SA), and the bottom superlattice 92 as superlattice B (SB). The photoelectrons in the second miniband of the SB 92 can tunnel through the separating barrier 93 due to the strong electric field applied on the barrier 93. The escaped photoelectrons result in net positive charges to attract electrons from the bottom contact 91 and cause photocurrent in the external circuit. On the contrary, the escaped photoelectrons in SA 94 cause electrons from the top contact 95 and result in internal current circulation as shown in FIG. 10(b). Therefore, only SB 92 is active under positive bias. In the same way, only SA 94 is active under negative bias. This characteristic makes the spectral responsivity switchable by the bias polarity between the two wavelength regimes corresponding to the respective miniband transitions of SA 94 and SB 92. Particularly, photoelectrons with different energy relative to the edge of the separating barrier exhibits different voltage dependences of the tunneling probability. As a result, the spectral responsivity is also tunable by the magnitude of the applied voltage. For the detailed mechanism, please refer to our previous work. In brief, under low bias, the photoelectrons generated by short wavelength radiation have higher energy and tunneling probability to contribute to the photoresponse. The spectral responsivity is primarily in the short wavelength part at low bias magnitude under both polarities of applied voltage. However, under high bias magnitude, the tunneling probability of the photoelectrons in the bottom state of the second miniband increases, and the long wavelength responsivity can dominate the spectral responsivity. Therefore, the elaborately designed blocking layer 93 not only isolates the photocurrent from the SA 94 and SB 92 but it also serves as a high-pass energy filter for the photoelectrons in the second miniband. Since the superlattice have no voltage drop at operation, the spectral responsivity in each detection stack is not affected by the differential resistance as the conventional multi-stack QWIP. In addition the responsivity can be designed to have the same order of magnitude under both bias polarities by adjusting the barrier height Next, we will show the measured characteristics of our photodetector. The experimental results agree with our design principles.

Figure 11:
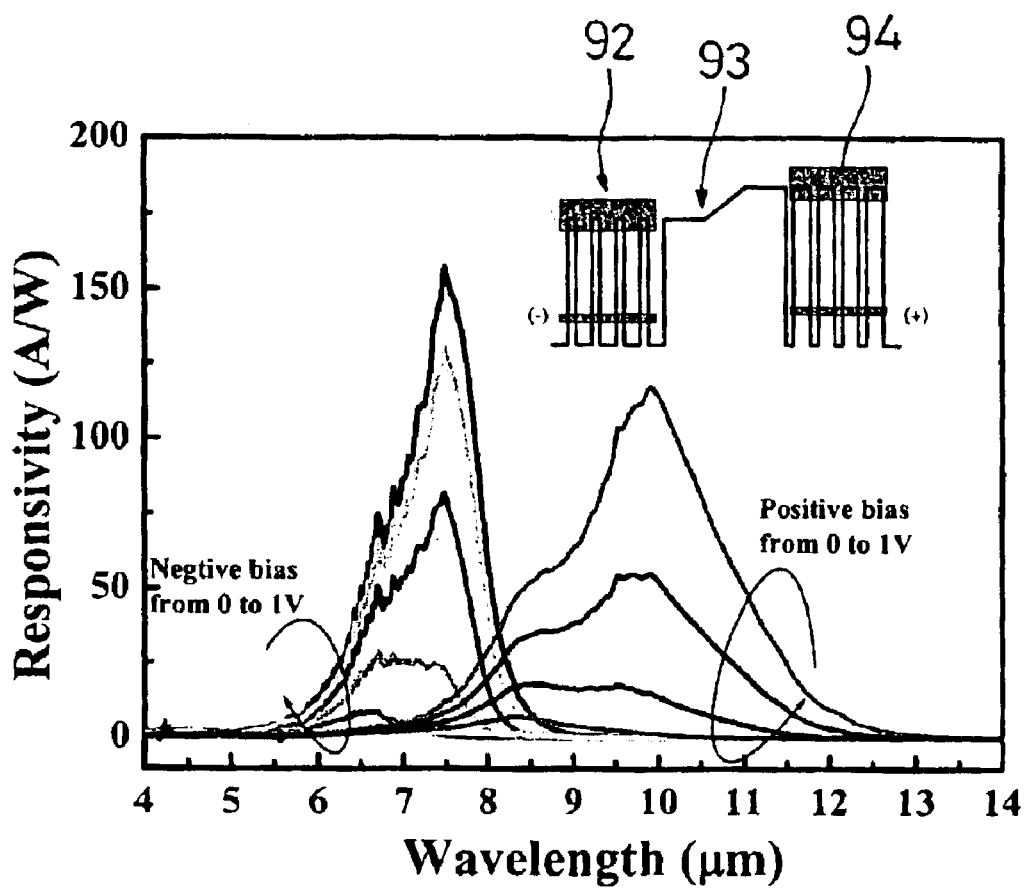
FIG. 11 shows the measured spectral responsivity at 30 K under several bias voltages in accordance with an embodiment of the present invention.

Please refer to FIG. 11, which shows the measured spectral responsivity shows little temperature dependence and the representative one at 30 K is in accordance with an embodiment of the present invention. Under positive bias, the spectral responsivity is dominated by the SB 92, and is tunable in 7.5~12 $\mu$m through the magnitude of the applied bias. While under negative bias, the spectral responsivity is dominated by the SA 94, and is also tunable in 6~8.5 $\mu$m. It is noted that the peak and shoulder positions under various magnitudes of applied bias remain the same without the Stark effect occurring at both bias polarities. This indicates the voltage drop on the superlattice is negligible. Also noted in FIG. 11 is the same order of responsivity at both voltage polarities, which is difficult to achieve by using conventional multi-color quantum well structures.

Figure 12:
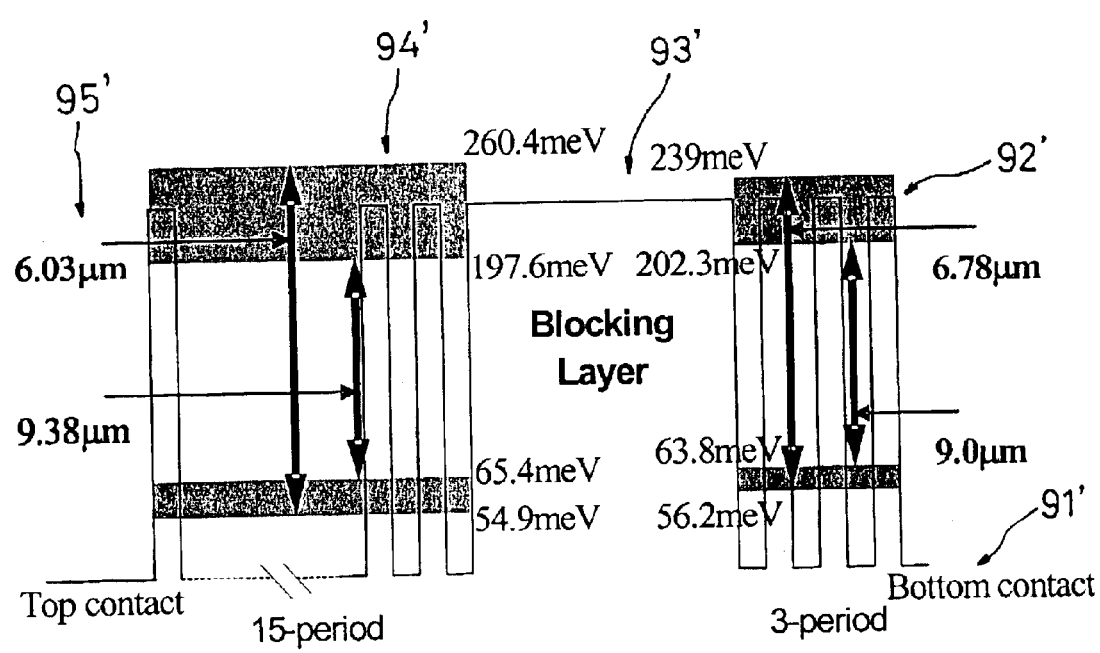
FIG. 12 shows the band structure of the photodetector with two different superlattices, the miniband ranges and their absorption wavelength can also be found in the figure.

Here we would like to introduce another sample, which has the similar structure with the above sample but the period numbers of the two superlattices are different and both less than 15. Please refer to FIG. 12, which shows the band structure of the photodetector sample. The bottom superlattice 92' has 3-period and the top superlattice 94' has 15-period. Each period of the superlattice 92' and 94' consists of 6 nm GaAs well doped with $1 \times 10^{18}$ cm$^{-3}$ of Si and 4 nm undoped $Al_{0.28}Ga_{0.72}As$ barrier. The blocking barrier 93' is undoped 2000 Å $Al_{0.28}Ga_{0.72}As$. According to the operational mechanism we discussed above, the photocurrent under positive bias is attributed to the bottom superlattice 92', i.e. 3-period one and under negative bias is attributed to the 15-period superlattice.

Figure 13:
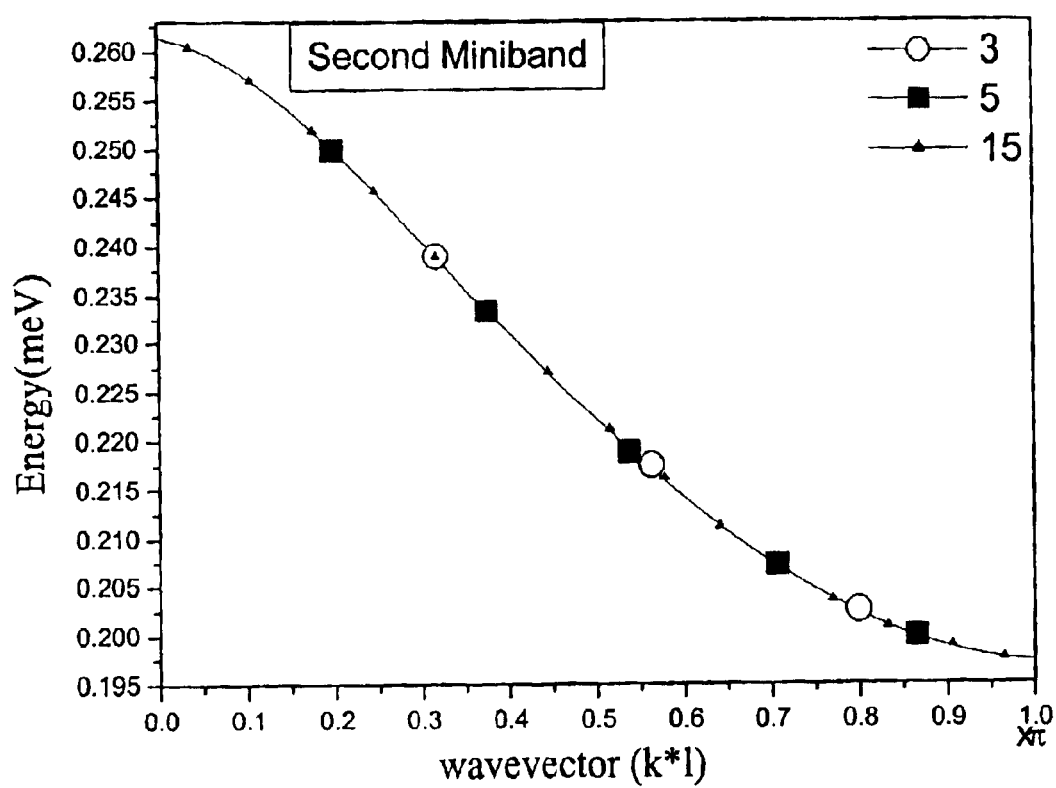
FIG. 13 shows the miniband dispersions of the second miniband for 3-, 5-, and 15-, and infinite-period SL's. According to, $$\vec{v}_k = \frac{1}{\hbar}\nabla_k \vec{E},$$

Please refer to FIG. 13, which shows the energy dispersion for E versus k of the second miniband for the superlattice with infinite periods and the same well and barrier structures we use in the experiment. The discrete energies for the superlattice with the period numbers of 3, 5, and 15 are also marked in the same plot. It is noted that the discrete energy states for the finite superlattice are close to the middle of the miniband for the infinite one. According to the group velocity, $$\left( \vec{v}_k = \frac{1}{\hbar} \nabla_k \vec{E} \right),$$

the photoelectrons at the top and the bottom states of the second miniband have slower velocity in 15-period superlattice than that in 3-period one. In the same way, the electron's group velocity is close to zero at the bottom state of the second miniband for the superlattice with many periods. Therefore, SLIP with few periods will have better performance based on the consideration of the group velocity. On the other hand, because of the short transit distance of few periods, photoelectrons will suffer less scattering and relaxation processes into the first miniband or the bottom states in the second miniband. This may result in high collection efficiency. The drawback of this structure is the low absorption coefficient due to few periods.

Please refer to FIG. 14(*a*) and 14(*b*), which show the spectral response under low and high bias. The solid lines are the photoresponses under positive bias for the 3-period superlattice and dashed lines are the ones under negative bias for the 15-period superlattice. The response is dominated by short-wavelength transition under low bias and shift to long wavelength as voltage increasing. Under positive bias, the main peak is at 6.7 $\mu$m when bias <0.9V and the peak at 7.8 $\mu$m appears at higher bias. For bias >1.3V, the main peak is at 9.35 $\mu$m and the lineshape of the responsivity does not vary with the bias voltage anymore. For negative bias, the main peak is 6.65 $\mu$m at low bias and is 9.5 $\mu$m under high bias. From FIG. 14, the voltage-tunable and -switchable photoresponse can also be observed and the superlattice with few periods has the better responsivity for both long wavelength response and short wavelength response.

Please refer to FIG. 15, which shows the responsivity of the 3-period superlattice and 15-period superlattice at different temperature. For temperature operating range, the 3-period SLIP can work well till 100K. On the other hand, the highest operational temperature is 90K for 15-period SLIP. Because of the better absorption coefficient, photoresponse at short wavelength range of many-period superlattice may be better. Hence the period number of superlattice is a factor we have to tune for the optimum performance. Although the low absorption coefficient is a drawback for few periods superlattice, we still consider the few period superlattice is a better structure for SLIP because of its high responsivity and operational temperature at long wavelength range.

The present invention proposes the superlattice structure for multicolor infrared photodetector, which has switchable and tunable photoresponses. The advantages of this invention are summarized below.

(i) The photoresponses of a single photodetector can be switched between two wavelength regions by the polarity of the applied bias.

(ii) The photoresponses can be tuned by the magnitude of the applied bias under both voltage polarities.

(iii) The same order photoresponses in the two wavelength regions.

(iv) The photoresponses in each wavelength regions can be optimized separately by the design of barrier heights at both sides of the blocking barrier.

(v) The photoresponses are insensitive to the operating temperatures or the background radiation.

(vi) In this invention, the detection wavelength can be switched by the voltage polarity to avoid disadvantages under high bias operation for long wavelength detection.

(vii) No extra process steps are needed to fabricate a multicolor focal plane array. Therefore the spatial resolution can be improved.

(viii) Low voltage operation and low power consumption.

(ix) SLIP with few periods has higher group velocity than the one with many periods.

(x) SLIP with few periods has better responsivity at long wavelength and higher operational temperature.

Because of the advantages of the proposed multicolor infrared photodetector structure, this invention is suitable for the design of multicolor focal plane array. The idea of this invention is not only applicable to the wavelength regions demonstrated here by the GaAs/$Al_xGa_{1-x}$As system. Designing two low impedance materials that can generate photoelectrons in both sides of a blocking barrier can also produce photoresponses that can be switched by the voltage polarity.

While the invention has been disclosed with reference to preferred embodiments thereof, it is to be understood that modifications or variations may be easily made without departing from the spirit of this invention, which is defined in the appended claims.

What is claimed is:

1. A multicolor infrared photodetector with photoresponse that are switched by a bias parity and tuned by a bias, magnitude comprising:

a bottom ohmic contact layer for providing ohmic contact to a metal;

a bottom, superlattice formed with n-type GaAs/$Al_xGa_{1-x}$As coupled to said bottom ohmic contact layer and absorbing infrared in two different wavelength regions;

a current blocking layer formed with undoped $Al_yGa_{1-y}$As coupled to said bottom superlattice for separating said bottom superlattice and serving as an energy filter for the photoelectrons, and reducing a dark current and a current because of a barrier height;

a top superlattice formed with n-type GaAs/$Al_xGa_{1-x}$As coupled to said current blocking layer and absorbing infrared in two different wavelength regions said current blocking layer separating said top and bottom superlattices; and a top ohmic contact layer coupled to said top superlattice and providing ohmic contact to said metal.

2. The infrared photodetector according to claim 1, wherein said bottom and top supedattices absorb infrared light in different wavelength regions.

3. The infrared photodetector according to claim 1, wherein said detection wavelength regions corresponding to said bottom and top superlattices are switched by the bias polarity, the bottom superlattice is operated under a positive bias and the top superlattice is operated under a negative bias, the positive bias is defined by the top ohmic contact layer being positively biased.

4. The infrared photodetector according to claim 1, wherein said photoresponses under both bias polarities are tuned by the bias magnitude because of the blocking layer.

5. The infrared photodetector according to claim 1, wherein said structure is grown on GaAs semiconductor substrate.

6. The infrared photodetector according to claim 1, wherein said epitaxial materials of the multicolor infrared photodetector are GaAs and AlGaAs semiconductor materials.

7. The infrared photodetector according to claim 1, wherein each period of said bottom and top superlattices is respectively composed of a GaAs well and a $Al_xGa_{1-x}$As barrier, the well and barrier thickness in each of the top and bottom superlattices are less than 10 nm to form a miniband and the composition x ranges are from 0.2 to 0.4.

8. The infrared photodetector according to claim 1, wherein said blocking barrier is selected form the group consisting of one $Al_xGa_{1-x}$As layer and an $Al_xGa_{1-x}$As layer and a graded $Al_yGa_{1-y}$As layer, wherein both composition x and y ranges are from 0.2 to 0.4, a barrier height of the blocking barrier is higher than a bottom state of a second miniband in the superlattice coupled to the blocking barrier.

9. The infrared photodetector according to claim 7, wherein both said contact layers and said well of the top and bottom superlattices have a doping concentration range from $5 \times 10^{17}$ to $1 \times 10^{18}$ cm$^{-3}$ of Si.

10. The infrared photodetector according to claim 1, wherein a period number of each GaAs/$Al_xGa_{1-x}$As superlattice is less than 15.

* * * * *